United States Patent [19]
Iwanaga

[11] Patent Number: 5,281,968
[45] Date of Patent: Jan. 25, 1994

[54] DC OFFSET CORRECTION CIRCUIT FOR A/D CONVERTER

[75] Inventor: Kenichi Iwanaga, Tokyo, Japan
[73] Assignee: NEC Corporation, Tokyo, Japan
[21] Appl. No.: 941,253
[22] Filed: Sep. 4, 1992
[30] Foreign Application Priority Data
  Sep. 6, 1991 [JP] Japan .................. 3-227485
[51] Int. Cl.⁵ .................. H03M 1/06
[52] U.S. Cl. .................. 341/118; 341/120; 364/571.01
[58] Field of Search .......... 341/118, 119, 120, 121; 364/571.01, 571.02, 571.03, 571.05

[56] References Cited

U.S. PATENT DOCUMENTS

| | | | |
|---|---|---|---|
| 4,097,860 | 6/1978 | Araseki et al. | 341/118 |
| 4,746,902 | 5/1988 | Tol et al. | 341/118 |
| 4,943,807 | 7/1990 | Early et al. | |
| 5,146,223 | 9/1992 | Muto | 341/118 |
| 5,177,697 | 1/1993 | Schanen et al. | 341/118 X |

OTHER PUBLICATIONS

"Digital Filters and Their Applications"; Cappellini et al.; Academic Press pp. 104–160, 1978.

"AK5326/27 16 Bits Oversampling Stereo A/D Converter" Asahi Kasei; Apr. 1989.

*Primary Examiner*—Howard L. Williams
*Attorney, Agent, or Firm*—Leydig, Voit & Mayer

[57] ABSTRACT

The present invention relates to an offset cancellation circuit of digital filtering system which is capable of responding to a variation of an offset value with variation of circuit constant of an A/D converter due to temperature variation, etc. The present offset cancellation circuit is constituted with a low-pass filter for deriving an offset cancellation component from an offset component contained in respective codewords y of output codeword sequence y(kT) (where k is an integer and T is a sampling period of the A/D converter) of a parallel B bits of the offset cancellation circuit at a predetermined ratio every sampling period and accumulating the derived offset cancellation components and an adder for reducing the accumulated offset cancellation components from the input codeword sequence x(kT) of the parallel B bits every sampling period and outputting it as the codeword sequence y(kT). As a result, the whole offset cancellation circuit constitutes a recursive, IIR type digital filter.

4 Claims, 6 Drawing Sheets

DC OFFSET CORRECTION CIRCUIT FOR A/D CONVERTER

BACKGROUND OF THE INVENTION

1. Field of the Invention

The present invention relates to a D.C. offset cancellation circuit and, particularly, to an offset cancellation circuit for removing a D.C. component contained in an output of an analog-to-digital converter.

2. Description of the Prior Art

An analog-to-digital (A/D) converter widely used in a digital signal processing device or a digital communication system has a problem that an analog modulator which is a key component of the converter produces D.C. drift inherently. Due to this D.C. drift, an output of the analog modulator may contain a D.C. offset (referred to as "offset" hereinafter) component. Such offset component may cause an overflow problem in arithmetic operation of integration and/or addition in, for example, a digital audio signal processing device to occur, which may be audible as click or noise. Therefore, such offset component is to be removed.

It is known that a low frequency component of such offset component can be removed by inserting a digital filter in a stage subsequent to the A/D converter and it is further known that a digital filter of such as non-recursive, finite impulse response (FIR) type has a sharp frequency cut-off characteristics. Nevertheless, such scheme has not been used practically since the number of filtering stages required in such signal processing device and hence the number of registers thereof required for holding data have to be increased, making size of such device very large.

Instead thereof, a calibration system has been used widely for removing offset component. This system is constituted, as disclosed in U.S. Pat. No. 4,943,807, such that an output digital value of an A/D converter, when a ground potential is input thereto prior to a start of A/D conversing operation, is stored in a memory and an output of the same A/D converter for an input analog signal supplied after start of the A/D conversing operation is corrected with the digital value read from the memory.

That is, the offset cancellation circuit of the calibration system includes, as basic components, an analog-to-digital converter, switch means having a movable contact terminal connected to an input terminal of the analog-to-digital converter and two fixed contact terminals, one being connected to an input analog signal source and the other being connected to ground potential, and responsive to a control signal for supplying ground potential to the input terminal of the analog-to-digital converter in an offset value detection mode and the input analog signal thereto in an ordinary mode, a random access memory (RAM) connected to an output terminal of the analog-to-digital converter and responsive to the control signal for storing the offset value and subtracter means for subtracting the offset value read from the random access memory from an output digital signal of the analog-to-digital converter in the ordinary mode. Since the digitized offset value indicates an offset component inherent to the analog-to-digital converter, the output digital signal at the output of the subtracter does not contain the offset component. An analog-to-digital converter including an offset cancellation circuit of this calibration system is disclosed in the user manual, "AK5326/27 16 Bits Oversampling Stero A/D Converter", April 1989, ASAHI KASEI.

In the above-mentioned offset cancelling method, since an offset component detected during a period of offset value detection mode and stored in a random access memory is maintained at a fixed value even when the offset value varies with variation of circuit constants of the constitutional components of the analog-to-digital converter due to temperature variation, there may be a difference or error produced between it and an actual offset value, which error may be a source of noise by which a dynamic range of the analog-to-digital converter may be narrowed. In order to solve this problem, it may be considered to increase frequency in use of offset value detection mode. In such case, however, the period of ordinary mode of the analog-to-digital converter may be shortened correspondingly, causing total performance thereof to be degraded.

BRIEF SUMMARY OF THE INVENTION

Object of the Invention

An object of the present invention is, therefore, to provide an offset cancellation circuit of a digital filtering type using a recursive, infinite impulse responsive (IIR) type digital filter which is capable of easily absorbing variation of an offset value of an analog-to-digital converter with variation of circuit constants of constitutional components thereof due to temperature variation.

Summary of the Invention

An offset cancellation circuit of a digital filtering system according to the present invention comprises a low-pass filter for deriving offset cancelling components from offset components contained in respective codewords y, each codeword being of parallel B bits, of an output codeword sequence y(kT) (where k is an integer and T is a sampling period of an analog-to-digital converter) of the offset cancellation circuit at a predetermined ratio in every sampling period and accumulating the derived offset cancelling components and an adder for subtracting the accumulated offset cancelling components from the input codeword sequence x(kT) of codewords each of parallel B bits in every sampling period and outputting a result as the codeword sequence y(kT). As a result, the whole offset cancellation circuit functions as a recursive, IIR type digital filter to converge the amount of offset components contained in the codeword sequence y(kT) to zero by repeating the recursion. The low-pass filter is constituted with a code converter for inverting sign of the respective codewords y of the output codeword sequence y(kT), adding logical "1" to a least significant bit (LSB) of each sign-inverted codeword, attaching a predetermined width A of bits each having a binary value of a most significant bit (MSB) of the sign-inverted codeword to a top of the codeword, and outputting a codeword sequence m(kT) of parallel (A+B) bits, a second adder for summing the codeword sequence m(kT) and a codeword sequence r(kT) having the same bit width as that of the codeword sequence m(kT) and outputting a codeword sequence q(kT), a delay circuit for delaying the codeword sequence q(kT) by a sampling period T and outputting the codeword sequence r(kT) and a branch circuit for outputting upper B bits of the codeword sequence r(kT) of the parallel (A+B) bits as the offset cancelling component.

Assuming that the sampling frequency is fs, a lower cut-off frequency fc is given by the following formula:

$$fc = 2^{-A} \times fs/2\pi$$

For example, when fs=48 (KHz) and A=10 (bits), fc becomes about 7.5 (Hz). Since audio frequency band is about 20 (Hz) to 20 (KHz), the lower cut-off frequency of 7.5 (Hz) is enough to allow the audio frequency band to pass through while cancelling only offset component.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
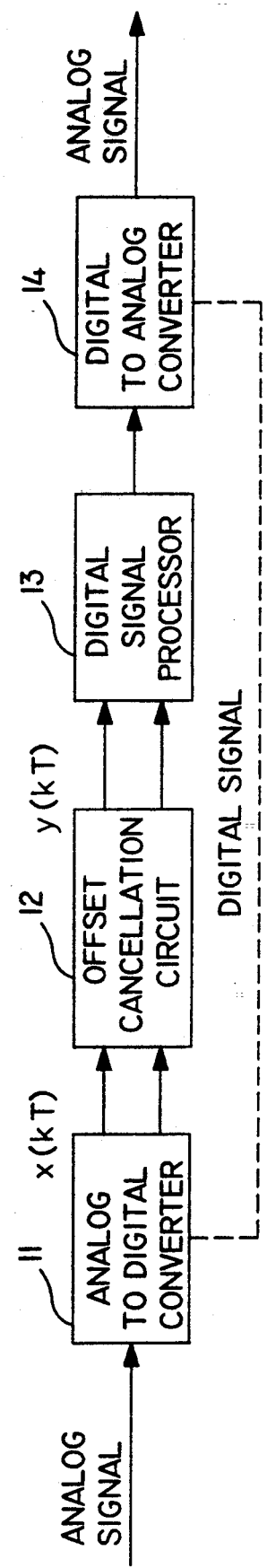
FIG. 1 is a block circuit diagram showing an example of a digitized audio signal processing system including an offset cancellation circuit according to the present invention.

Referring to FIG. 1, an input analog signal is sampled at a sampling period T in an analog-to-digital (A/D) converter 11 and each of respective sample values is converted into a parallel 16-bit binary codeword from least significant bit (LSB) to most significant bit (MSB) corresponding to quantized levels $2^0$ to $2^{15}$, respectively. That is, the input analog signal is converted into a sequence of parallel 16-bit binary codewords x(T), x(2T), x(3T), ..., x(nT), ... (denoted by x(kT) hereinafter). This codeword sequence x(kT) is processed by an offset cancellation circuit 12 and a resultant sequence of parallel 16-bit binary codewords y(T), y(2T), y(3T), ..., y(nT), ... (denoted by y(kT) hereinafter) is supplied to a digital signal processor 13 such as a digitized audio signal amplifier. The processing of the codeword sequence x(kT) in the offset cancellation circuit 12 will be described later. An output of the signal processor 13 is digital-to-analog converted by a digital-to-analog (D/A) converter 14 and supplied to a loud speaker (not shown) as an audio signal.

Figure 2:
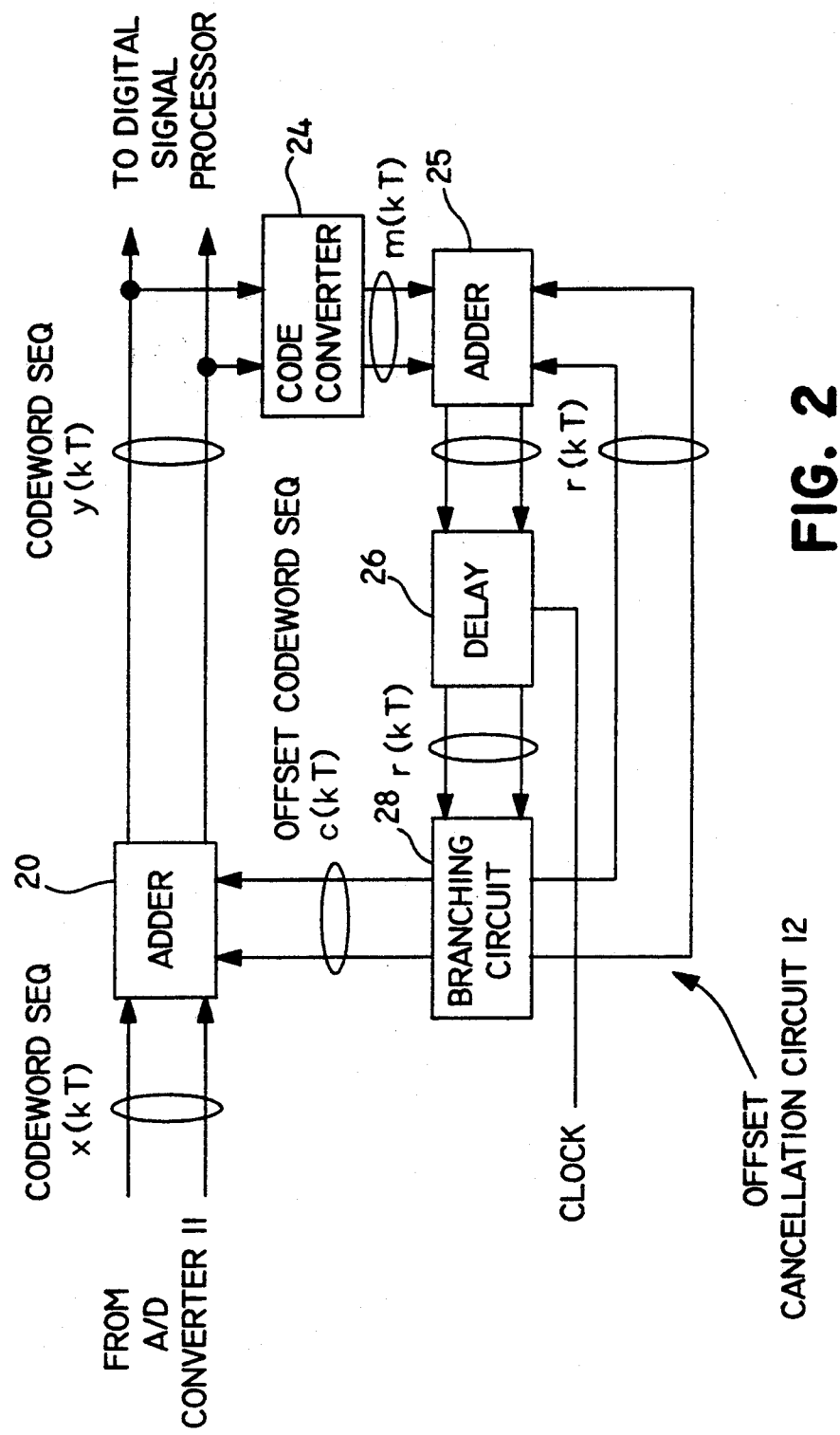
FIG. 2 is a block circuit diagram of an embodiment of an offset cancellation circuit 12 of the present invention.

Referring to FIG. 2 showing a construction of the offset cancellation circuit 12 in block circuit form, the codeword sequence x(kT) is supplied to a first sequence of input terminals of a first adder 20 and added to an offset codeword sequence c(T), c(2T), c(3T), ..., c(nT) ... (denoted by c(kT) hereinafter and will be described later) supplied to a second sequence of input terminals of the same adder 20, respectively, resulting in the codeword sequence y(kT), that is, the output of the offset cancellation circuit 12.

On the other hand, to the most significant bit of each codeword of the codeword sequence y(kT), parallel 10 bits to be described later are added and a resultant parallel 26-bit binary codeword sequence m(T), m(2T), m(3T), ..., m(nT) ... (denoted by m(kT) hereinafter) are supplied to a first sequence of input terminals of a second adder 25 and added to a parallel 26-bit binary codeword sequence r(T), r(2T), r(3T), ..., r(nT), ... (denoted by r(kT), hereinafter and will be described later) supplied to a second sequence of input terminals of the same adder 25, respectively. A resultant parallel 26-bit binary codeword sequence from the adder 25 is delayed by an amount equal to the sampling period T by means of a delay circuit 26 driven by clock pulse from a clock pulse source (not shown), resulting in the aforesaid codeword sequence r(kT). This codeword sequence r(kT) is supplied through the branching circuit 28 to the second adder 25 as mentioned above and a branching output of the branching circuit 28 is supplied to the second sequence of input terminals of the first adder 20 as the codeword sequence c(kT).

Figure 3:
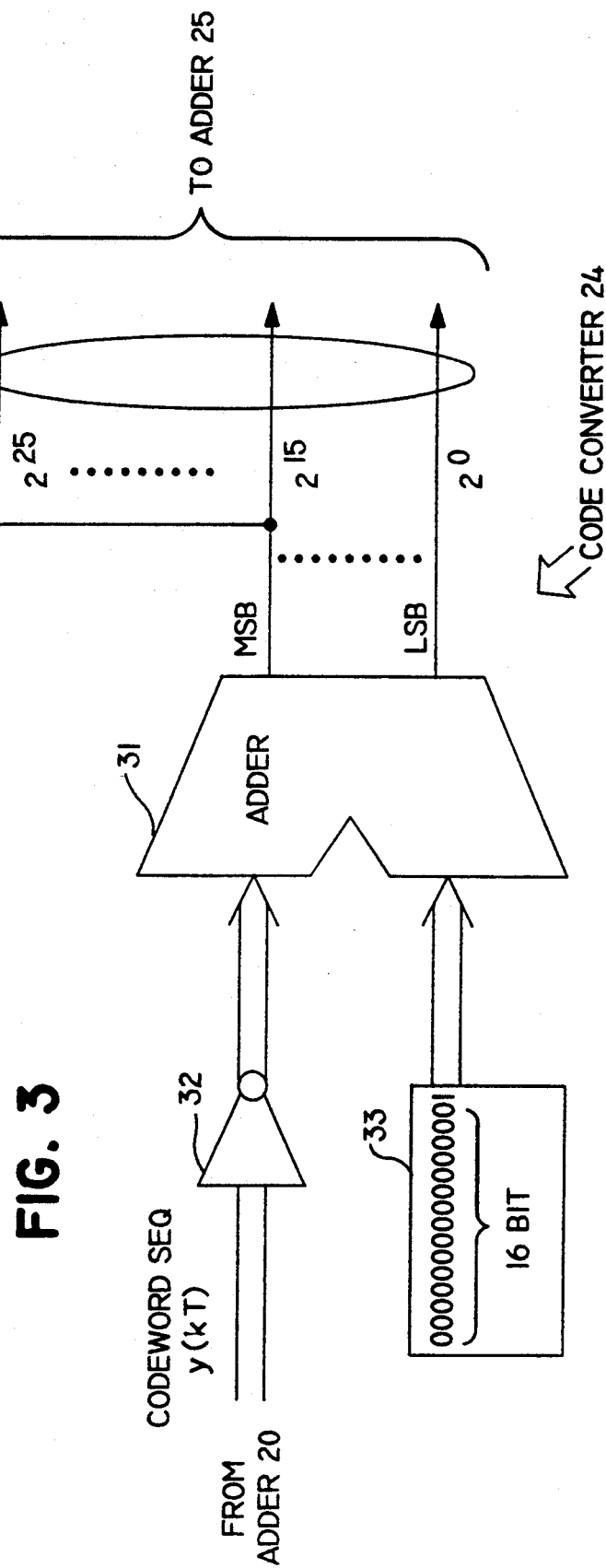
FIG. 3 is a block circuit diagram of an example of a data conversion circuit 24 in FIG. 2.

Referring to FIG. 3 showing a construction of the code converter 24, the code converter 24 comprises a logical inversion circuit 32 for logically inverting respective bits of each codeword of the codeword sequence y(kT) from the first adder 20 to produce a parallel 16-bit, logically inverted output codeword sequence (denoted by $\bar{y}(kT)$), a code pattern generator circuit 33 for generating, correspondingly to each codeword of the codeword sequence $\bar{y}(kT)$, a parallel 16-bit code pattern including a least significant bit of "1" and other bits of "0" and an adder circuit 31 for summing in parallel each codeword of the codeword sequence $\bar{y}(kT)$ from the circuit 32 and the code pattern from the circuit 33 and adding, to the upper side of the most significant bit of each codeword of a resultant, summed 16-bit codeword sequence, parallel 10 bits having the same code value as that of the most significant bit of the codeword to produce the aforesaid parallel 26-bit, binary codeword sequence m(kT).

Figure 4:
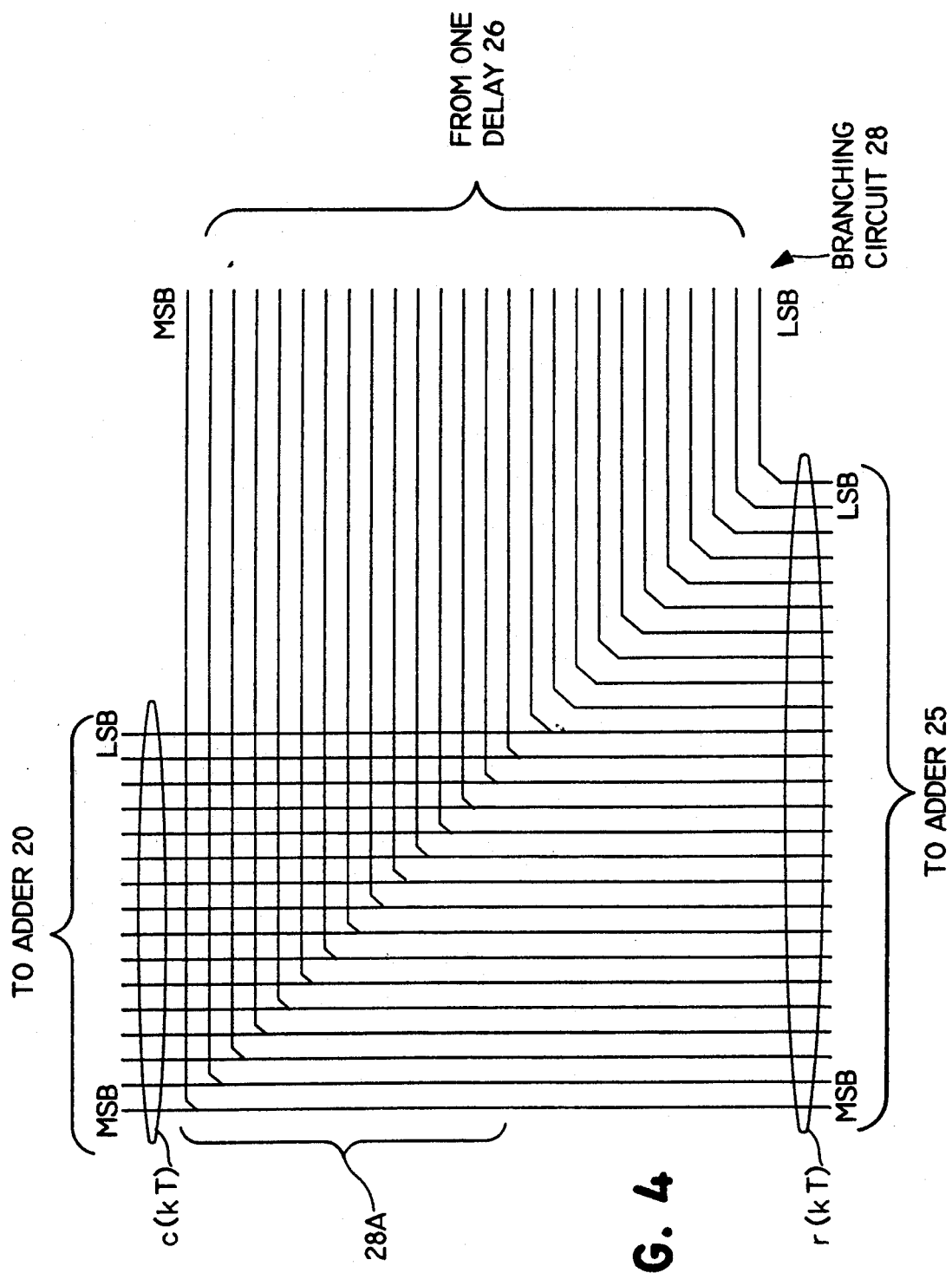
FIG. 4 is a block circuit diagram of a branching circuit 28 in FIG. 2.

Referring to FIG. 4 which shows the branching circuit 28, the latter receives, through the delay circuit 26, the summed codeword sequences m(kT) and r(kT) from the second adder 25 in the form of a parallel 26-bit, binary codeword sequence. The branching circuit 28 comprises a wired logic circuit 28A which serves to supply 26 bits of each codeword of the last mentioned 26-bit codeword sequence to the second adder 25 directly as the codeword sequence r(kT) and supply the most significant 16 bits of the same 26-bit codeword including the most significant bit of the 16-bit codeword to the first adder 20 as the codeword sequence c(kT).

Figure 5:
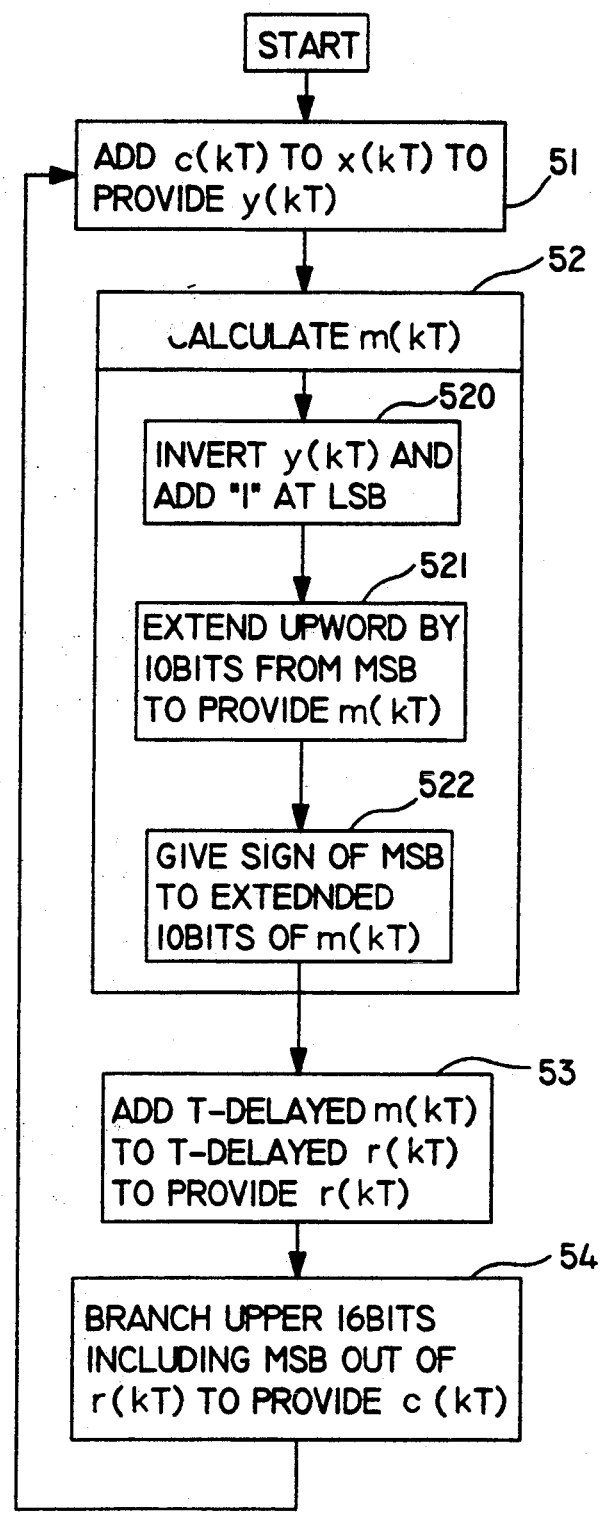
FIG. 5 is a flowchart showing an operation of the embodiment.

Referring to FIG. 5 which shows a flowchart of an operation of the above-mentioned embodiment, by an addition of the input codeword sequence x(kT) and the offset codeword sequence c(kT) in the first adder 20, the adder output codeword sequence y(kT) is obtained (step 51), the latter codeword sequence y(kT) is converted into the parallel 26-bit binary codeword sequence m(kT) by the code converter 24 (step 52). This codeword conversion is performed by an operation of logically inverting the codeword sequence y(kT) and adding 1 to a least significant bit of the resultant inverted codeword sequence (step 520), adding 10 bits to the upper side of a most significant bit thereof (step 521) and setting a code value of the most significant bit to each of the added 10 bits (step 522). A resultant sum of the codeword sequence m(kT) and the output codeword sequence r(kT) from the T delay circuit 26 obtained from the second adder 25 is output as the delayed codeword sequence r(kT) (step 53). Upper 16 bits including the most significant bit of the codeword sequence r(kT) are fedback to the first adder 20 as the offset codeword sequence c(kT) (step 54).

Figure 6:
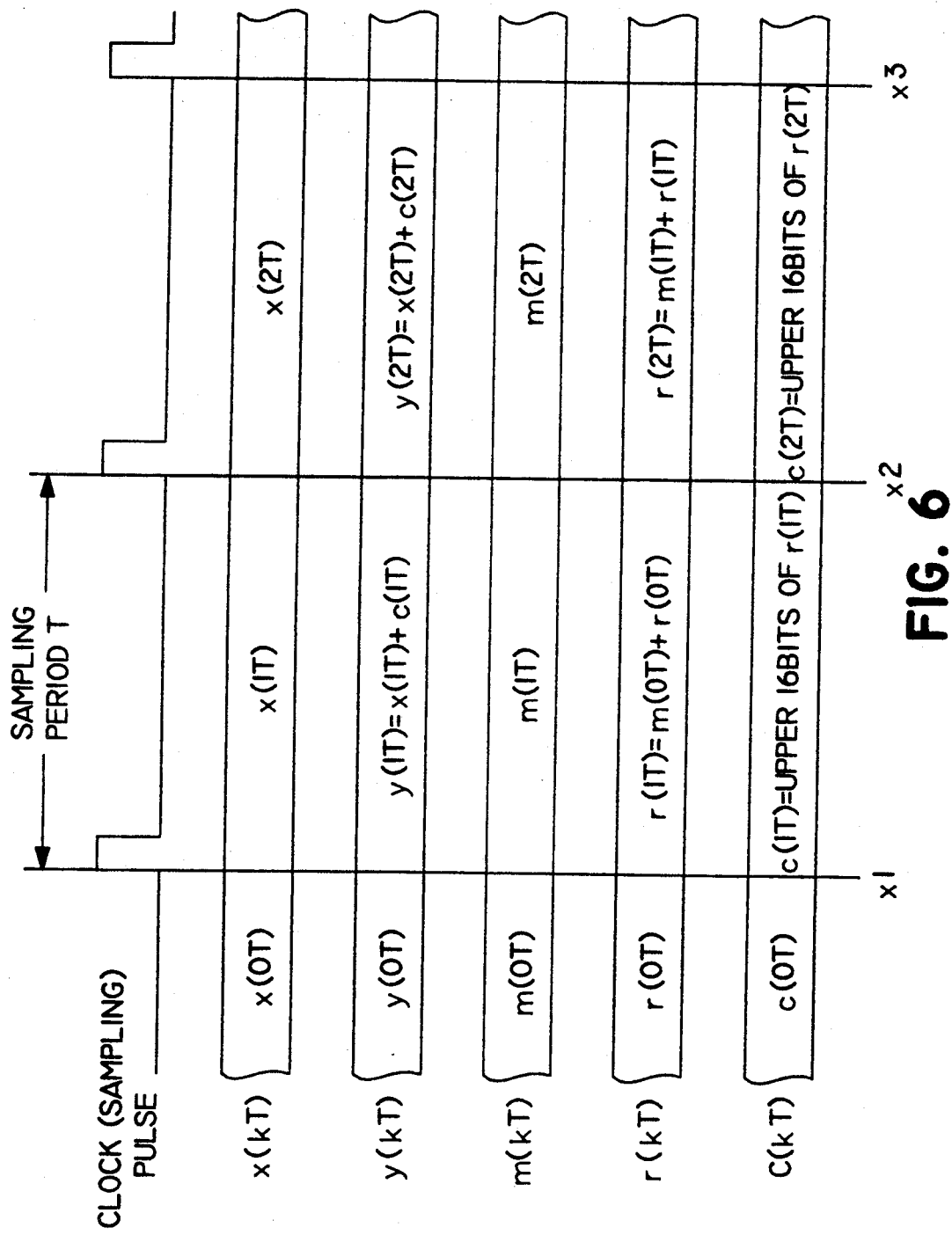
FIG. 6 is a time-chart for the embodiment.

FIG. 6 shows a timing relation among the abovementioned codeword sequences x(kT), y(kT), m(kT), r(kT) and c(kT). As shown, up to a time instance t1 defined by a Sampling period T of clock pulse (sampling pulse in the A/D converter 11), these codeword sequences take values x(0T), y(0T), m(0T), r(0) and c(0T), respectively, and in a period between t1 and t2, they take values x(1T), y(1T), i.e., x(1T)+c(1T), m(1T), r(1T), i.e., m(0T)+r(0T), and c(1T), i.e., upper 16 bits of the codeword r(1T), respectively. In a time period between t2 and t3, they take values x(2T), y(2T), i.e., x(2T)+c(2T), m(2T), r(2T), i.e., m(1T)+r(1T), and c(2T), i.e., upper 16 bits of the codeword r(2T), respectively, and so on. For example, assuming an offset component of 8 bits (value in quantization level is 255) produced at t=0, i.e., 0T, as an input codeword x(0), y(0)=255 and $m(0) = -255 \times 2^{-10}$ since r(0)=0 (assuming that it is initially set to 0) and hence c(0)=0. At t=T, since $r(T) = -255 \times 2^{-10}$ and hence c(T)=0, y(T)=255 and $m(T) = -255 \times 2^{-10}$. At t=2T, since $r(2T) = -(255 \times 2^{-10} + 255 \times 2^{-10})$ and hence c(2T)=0 as yet, y(2T)=255 and $m(2T) = -255 \times 2^{-10}$. By repeating these procedures, it becomes, at t=5T, that $r(5T) = -5 \times (255 \times 2^{-10})$ and c(5T)=-1. Therefore, the absolute value of c becomes larger than 0 and an actual subtraction with respect to x is started, resulting in y(5T)=255-1 and $m(5T) = -(255-1) \times 2^{-10}$. By repeating subtraction, the value of y converges on zero at t=5753T, that is, at 5753-th sampling.

According to the theory of recursive type digital filter (cf. V. Cappellini, A. G. Constantinides and P. Emilliani: Digital Filters and Their Applications, Academic Press 1978), the relation between functions Y(z) and M(z) obtained by z transformation of a parallel 16-bit codeword sequence y(kT) and a parallel 26-bit codeword sequence m(kT), respectively, is represented as follow:

$$M(z) = Y(z) * (-2^{-10}) \quad (1)$$

Similarly, a relation between a function R(z) resulting from z transformation of the codeword sequence r(kT) and the M(z) represented by the equation (1) is represented by the following equation:

$$R(z) = (Z^{-1}/(1-Z^{-1})) * M(z) \quad (2)$$

The equation (2) indicates that the portion of the offset cancellation circuit 12 including the code converter circuit 24, the second adder 25 and the delay circuit 26 functions as a low-pass filter. Since, therefore, the codeword sequence c(kT) composed of upper 16 bits of the sequence r(kT) output from the delay circuit 26 is fedback to the first adder 20 as the offset codeword sequence and added with the input codeword sequence x(kT), the offset component can be cancelled. Further, due to the characteristics of the recursive digital filter, this offset component converges to 0. Time (integer multiples of sampling period T) required for obtaining this convergence depends on the number of bits to be added in the code converter circuit 24. Transfer function H(z) of the offset cancellation circuit 12 according to the present invention is represented by a ratio between the functions Y(z) and X(z) resulting from z transformation of the codeword sequences y(kT) and x(kT), as follows:

$$\begin{aligned} H(z) &= Y(z)/X(z) \\ &= (1 - Z^{-1})/[1 - (1 - 2^{-10}) Z^{-1}] \end{aligned} \quad (3)$$

The equation (3) indicates that the offset cancellation circuit 12 functions as a high-pass filter whose cut-off frequency fc is given as follow where fs is sampling frequency:

$$fc = 2^{-10} \times fs/2\pi \quad (4)$$

Since, in this embodiment, fs is selected as 48 kHz, the cut-off frequency fc is about 7.5 Hz which is lower enough than the lower limit 20 Hz of the audible frequency range.

As another example of the data converter 24, a scheme, in which respective codewords of a parallel 16-bit codeword sequence y(kT) are multiplied with a preliminarily prepared code pattern having a 16-bit negative coefficient and a result is output as a parallel 26-bit binary codeword sequence m(kT) will be described. Assuming the negative coefficient value as −K, the equation (3) can be rewritten as follow:

$$\begin{aligned} H(z) &= Y(z)/X(z) \\ &= (1 - Z^{-1})/[1 - (1 - K) Z^{-1}] \end{aligned} \quad (5)$$

Cut-off frequency fc in the equation (5) is given as follow where sampling frequency is fs:

$$fc = K \times fs/2\pi \quad (6)$$

By setting the coefficient value K to a sufficiently small value, the lower cut-off frequency fc can be made low enough compared with the audible frequency range.

Although the present invention has been described with reference to a specific embodiment, this description is not meant to be construed in a limiting sense. Various modifications of the disclosed embodiment, as well as other embodiments of the present invention, will become apparent to persons skilled in the art upon reference to the description of the present invention. It is therefore contemplated that the appended claims will cover any modifications or embodiments as fall within the scope of the present invention.

What is claimed is:

1. A DC offset cancellation circuit for an analog-to-digital converter, comprising:

a first adder for adding an input codeword sequence x(kT) input at a sampling period T equal to a sampling pulse period for an analog-to-digital conversion of an input analog audio frequency signal and including codewords each of B bits to an offset cancellation codeword sequence c(kT) supplied at said sampling period and including codewords each of B bits and outputting an output codeword sequence y(kT) having offset cancelled at said sampling period, where k and B are integers, respectively;

a code converter for logically inverting respective bits of each codeword y of said output codeword sequence y(kT), adding a bit "1" to the least significant bit of the inverted codeword y to produce a codeword y1, adding A bits to a most significant bit of the codeword y1, setting values of said A bits to a binary value of said most significant bit of said codeword y1 and outputting it as a codeword sequence m(kT) including codewords each of (A+B) bits, where A in an integer;

a second adder for adding said codeword sequence m(kT) to a codeword sequence r(kT) including codewords each of (A+B) bits and outputting a codeword sequence q(kT) including codewords each of (A+B) bits;

a delay circuit for delaying said codeword sequence q(kT) by a time equal to said sampling period T and outputting said codeword sequence r(kT) with delay; and a branching circuit for outputting said upper B bits of each codeword of said codeword sequence r(kT) as said offset removed codeword sequence c(kT).

2. A DC offset cancellation circuit for an analog-to-digital converter, comprising:

a first adder for adding an input codeword sequence x(kT) input at a sampling period T equal to a sampling pulse period for an analog-to-digital conversion of an input analog audio frequency signal and including codewords each of B bits to an offset removing codeword sequence c(kT) supplied at said sampling period and including codewords each of B bits and outputting an output codeword sequence y(kT) having offset cancelled at said sampling period, where k and B are integers, respectively;

a code converter for multiplying respective bits of each codeword of said output codeword sequence y(kT) with a predetermined negative coefficient value of B bits and outputting a codeword sequence m(kT) including codewords each of (A+B) bits corresponding to upper (A+B) bits of a result of said multiplication;

a second adder for adding said codeword sequence m(kT) to a codeword sequence r(kT) including codewords each of (A+B) bits and outputting a codeword sequence q(kT) including codewords each of (A+B) bits;

a delay circuit for delaying said codeword sequence q(kT) by a time equal to said sampling period T and outputting said codeword sequence r(kT); and a branching circuit for outputting said upper B bits of each codeword of said codeword sequence r(kT) as said offset removing codeword sequence c(kT).

3. The DC offset cancellation circuit claimed in claim 1, wherein B is 16 and A is 10.

4. The DC offset cancellation circuit claimed in claim 2, wherein B is 16 and A is 10.

* * * * *